United States Patent
Sakaguchi et al.

[11] Patent Number: 5,656,829
[45] Date of Patent: Aug. 12, 1997

[54] SEMICONDUCTOR LIGHT EMITTING DIODE

[75] Inventors: Yasuyuki Sakaguchi; Sigemasa Nakamura; Yasuo Hosokawa, all of Chichibu; Yutaka Saito, Tokyo, all of Japan

[73] Assignee: Showa Denko K.K., Tokyo, Japan

[21] Appl. No.: 498,785

[22] Filed: Jul. 5, 1995

[30] Foreign Application Priority Data

Aug. 30, 1994 [JP] Japan .................. 6-205323
Mar. 9, 1995 [JP] Japan .................. 7-050107

[51] Int. Cl.$^6$ .................. H01L 33/00; H01L 27/15
[52] U.S. Cl. .................. 257/94; 257/95; 257/82; 257/85; 257/201
[58] Field of Search .................. 257/21, 112, 76, 257/82, 85, 89–97, 184–189

[56] References Cited

U.S. PATENT DOCUMENTS

| | | | |
|---|---|---|---|
| 5,075,743 | 12/1991 | Behfar-Rad . | |
| 5,153,889 | 10/1992 | Sugawara et al. | 257/16 |
| 5,255,279 | 10/1993 | Takahashi et al. | 372/46 |
| 5,285,087 | 2/1994 | Narita et al. | 257/194 |
| 5,296,717 | 3/1994 | Valster et al. | 257/13 |
| 5,386,310 | 1/1995 | Haneda et al. | 359/107 |
| 5,442,204 | 8/1995 | Mensz | 257/97 |

FOREIGN PATENT DOCUMENTS

0420691A2 4/1991 European Pat. Off. .
4100668A1 7/1991 Germany .

*Primary Examiner*—Wael Fahmy
*Assistant Examiner*—Fetsum Abraham
*Attorney, Agent, or Firm*—Armstrong, Westerman, Hattori, McLeland & Naughton

[57] ABSTRACT

A semiconductor light emitting diode includes a compound semiconductor substrate and a double-hetero structure of $(Al_xGa_{1-x})_yIn_{1-y}P$ ($0 \leq x \leq 1$, $0 < y < 1$) as an active layer, and an upper clad layer of the double-hetero structure has a larger band gap energy (Eg) than the band gap energy of the active layer and has a thickness of 3–50 μm.

25 Claims, 6 Drawing Sheets

SEMICONDUCTOR LIGHT EMITTING DIODE

BACKGROUND OF THE INVENTION

1. Field of the Invention

This invention relates to a semiconductor light emitting diode, more particularly to a semiconductor light emitting diode having an $(Al_xGa_{1-x})_yIn_{1-y}P$ double-hetero structure which emits yellow to orange light with high emission efficiency.

2. Description of the Prior Art

Light emitting diodes (LEDs) that utilize an epitaxial growth layer formed on a compound semiconductor substrate are characterized by low power consumption, long service life, high emission efficiency, high reliability and other merits, and are therefore widely used as light sources in various types of display devices. Among the various III–V group compound semiconductors, $(Al_xGa_{1-x})_yIn_{1-y}P$ mixed crystal epitaxially grown on a GaAs single crystal substrate and lattice-matched therewith is of the direct transition type and has maximum band gap energy. Since it is therefore capable of bright emission over the green to red region, its range of utilization is expanding rapidly.

Figure 12:
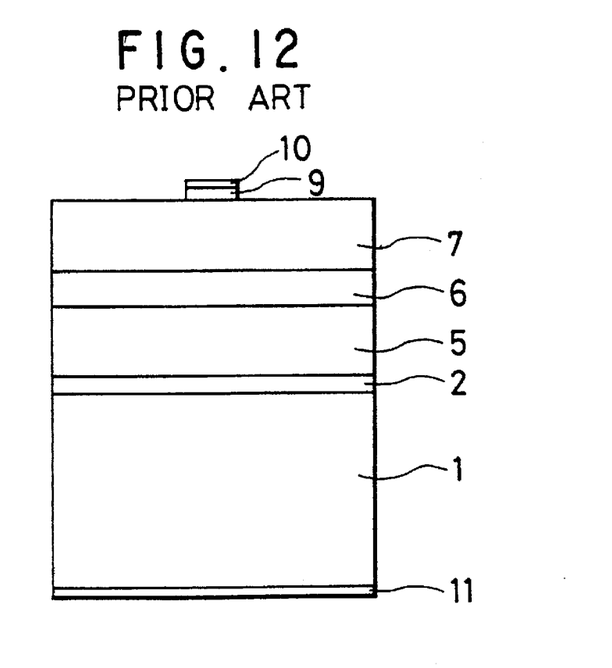
FIG. 12 is a sectional view for explaining the structure of a prior art double-hetero structure semiconductor light emitting diode.

FIG. 12 shows an example of a prior art LED having an $(Al_xGa_{1-x})_yIn_{1-y}P$ double-hetero (DH) structure. In this figure, reference numeral 1 designates a GaAs substrate, 2 a buffer layer, 5–7 the $(Al_xGa_{1-x})_yIn_{1-y}P$ DH structure section, 9 a contact layer, and 10 and 11 electrodes. A number of improvements have been proposed regarding this type of $(Al_xGa_{1-x})_yIn_{1-y}P$ LED, including the provision of an AlGaAs current diffusion layer of a thickness not exceeding 2 μm under the contact layer 9 for diffusing the current injected from the electrode 10 so as to broaden the light emitting range and the provision of a reflecting layer between the DH structure and the substrate for effectively emitting light directed toward the substrate. (U.S. Pat. No. 5,153,889.)

Increasing outdoor use of LEDs has led to a demand for brighter devices and a particularly strong need has arisen for bright LEDs emitting light in the 590–650 nm wavelength band. Although LEDs provided with a so-called window layer have been developed in response to this need, even these are not sufficiently bright. Further, since the Al content of the GaAlAs constituting the current diffusion layer and window layer is made large (0.7 to 0.8 based on the total of all elements as unity; hereinafter the same) so as to make these layers transparent to the emitted light, the LED undergoes progressive deterioration during use owing to the strong tendency for the Al to be oxidized. When an attempt is made to obtain an epitaxial growth layer with high Al concentration, moreover, the mismatching of the crystal lattices becomes large and the resulting lattice defects make it impossible to obtain high emission efficiency.

The present invention was accomplished for overcoming these shortcomings of the prior art and has as its object to provide a semiconductor LED which exhibits high emission efficiency in the 550–650 nm wavelength region and does not deteriorate over long periods of use.

SUMMARY OF THE INVENTION

For achieving this object, the invention provides a semiconductor light emitting diode comprising a compound semiconductor substrate and a double-hetero structure of $(Al_xGa_{1-x})_yIn_{1-y}P$ ($0 \leq x \leq 1$, $0 < y < 1$) as an active layer sandwiched between upper and lower clad layers, the upper clad layer being relatively thick and satisfying one condition among: that the band gap energy thereof is larger than the band gap energy of the active layer, that the band gap energy thereof gradually decreases with increasing distance from the light emitting side of the active layer and that the carrier concentration distribution thereof gradually increases with increasing distance from the light emitting side of the active layer.

In the semiconductor light emitting diode constituted according to this invention in the foregoing manner, the relatively greater thickness of the upper clad layer of the double-hetero structure causes the carriers injected from the electrode to spread over a wide area of the active layer, thereby increasing the emission efficiency and brightness and preventing decrease of emission intensity with passage of time. In addition, making the band gap energy of the upper clad layer larger than that of the active layer enhances the effect of confining carriers in the active layer. Further, making the band gap energy of the upper clad layer gradually decrease with increasing distance from the light emitting side of the active layer ensures effective injection of carriers into the upper clad layer. Still further, making the carrier concentration of the upper clad layer gradually increase with increasing distance from the light emitting side of the active layer increases the area of carrier injection into the active layer from the upper electrode, thereby producing a direct increase in emission efficiency and in addition an effective indirect increase in emission efficiency by preventing diffusion of added impurities to the active layer.

The above and other features of the present invention will become apparent from the following description made with reference to the drawings.

DESCRIPTION OF THE PREFERRED EMBODIMENT

The semiconductor light emitting diode according to this invention is constituted basically of a compound semiconductor substrate and a double-hetero structure light emitting layer of $(Al_xGa_{1-x})_yIn_{1-y}P$ formed as an active layer sandwiched between upper and lower clad layers on the semiconductor substrate.

Although the compound semiconductor substrate must be able to secure electrical contact with the DH section and must not adversely affect the formation of upper layers to be described later, it is not otherwise particularly limited. However, since the DH section is made of III-IV group crystal, physical property considerations make it preferable for the substrate to also be of III-V group crystal. In addition, since the invention uses a four-element system to secure emission in the 550–650 nm wavelength range, the optimum substrate material from the viewpoint of lattice matching is GaAs single crystal. The conductivity of the substrate can be either n-type or p-type. If it is of n-type, an active layer of excellent crystallinity can be easily obtained. While the carrier concentration is not particularly specified, the most commonly obtained carrier concentration is $(0.5-20)\times10^{17}$ $cm^{-3}$. If a p-type substrate is used, the thick upper clad layer, a key constituent of the present invention, becomes n-type. An n-type four-element system can be more easily increased in impurity concentration than a p-type one and its electron mobility is much larger than its Hall mobility. The current diffusion effect of an n-type thick clad layer is therefore greater than that of a p-type one. While the carrier concentration of the p-type substrate is not particularly specified, it is $(4-10)\times10^{18}$ $cm^{-3}$ for commonly obtained p-type GaAs substrates. The basic face orientation of the substrate is (100) but the invention is not limited to this. It is also possible to use a substrate with an inclined angle.

A GaAs buffer layer is deposited on the upper surface of the substrate for preventing diffusion of impurities from the substrate and eliminating the effect of lattice defects. The thickness of the buffer layer is typically 0.1–1 μm and its carrier concentration is typically $(0.5-1)\times10^{18}$ $cm^{-3}$ in the case of an n-type substrate and $(1-6)\times10^{18}$ $cm^{-3}$ in the case of a p-type substrate.

Next, an $(Al_xGa_{1-x})_yIn_{1-y}P$ double-hetero structure light emitting layer is formed on the buffer layer. The value ranges of x and y are defined as ($0 \leq x \leq 1$, $0<y<1$). Although the physical property values of the four-element system are a function of x and y, it is known that the band gap energy (and therefore the index of refraction) is mainly a function of x and the lattice constant mainly a function of y. As regards the composition ranges, y can be selected according to the substrate within the range enabling lattice matching. The case of y=0 is eliminated, however, because it results in no Al content and makes it impossible to form the DH band structure. On the other hand, when y=1 the mixed crystal becomes $Al_xGa_{1-x}P$, which is an indirect transition semiconductor over the entire composition range. It is therefore meaningless to use this mixed crystal as the active layer of a high-brightness LED. Moreover, its use as the clad material must be accompanied by addition of In to the active layer, but this induces the lattice mismatching referred to earlier and makes it impossible to obtain a highly reliable LED. Regarding y, therefore, the composition range of the four-element system is defined as 0<y<1. The absence of lattice mismatching at the DH section improves the crystallinity and effectively increases the emission efficiency of the LED. For this reason, y should preferably be about 0.5 in the case of using a GaAs (100) substrate, for example.

The $(Al_xGa_{1-x})_yIn_{1-y}P$ double-hetero structure consists of a lower clad layer, an active layer and an upper clad layer, with the active layer sandwiched between clad layers having larger band gap energies than its own. While y of the $(Al_xGa_{1-x})_yIn_{1-y}P$ active layer is set similar to that of the clad layers in the interest of the aforesaid lattice matching, x is set based on the desired emission wavelength. Possible combinations between the active layer and the clad layers include, for example, AlGaInP only, AlGaInP and GaInP, and AlInP and AlGaInP. The band gap energies of the clad layers have to be greater than that of the active layer because when they are not, the clad layers become absorbers owing to interband transition of internal carriers. For enabling the clad layers to more effectively confine carriers in the active layer, it is preferable, assuming use at room temperature, for the band gap energy of the clad layers to be made at least 0.1 eV larger than that of the active layer. For this, the Al mixing ratio x of the clad layers is regulated to a larger value than that of the active layer. Table 1 shows the composition and composition ranges of the active layer and the clad layers for different target emission wavelengths in the case of using a GaAs (100) substrate.

| Target emission wavelength | Al mixing ratio x of active layer and band gap | | Al mixing ratio of clad layers and band gap | |
|---|---|---|---|---|
| (nm) | x | Eg [eV] | x | Eg [eV] |
| 650 | 0 | 1.90 | $\geq 0.7$ | 2.28 |
| 630 | 0.15 | 1.97 | " | " |
| 620 | 0.17 | 2.00 | " | " |
| 600 | 0.34 | 2.06 | " | " |
| 590 | 0.48 | 2.10 | 1.0 | 2.35 |
| 570 | 0.58 | 2.18 | " | " |

In all cases y was set at 0.5 to optimize lattice matching with the GaAs (100) substrate.

The range of x is set based on the target emission wavelength. As x increases, however, the band gap of the four-element system also increases and the four-element system enters the indirect transition region when x exceeds a certain value. A four-element system of such composition cannot be used to obtain an LED with high luminance. For example, since y=0.5 in a four-element system DH structure lattice-matched with a GaAs (100) substrate, the range of x usable in the active layer is $0 \leq x \leq 0.7$. When x=0, the mixed crystal becomes GaInP and the emission wavelength at the composition at which the lattice matches with the GaAs (100) substrate is 650 nm (red). Similarly, the emission wavelength is 550 nm (green) when x=0.7. This is the upper limit of the mixing ratio x at which the four-element active layer can be used in a lattice-matched condition with the GaAs (100) substrate. Even in this case, however, the mixing ratio x can be further increased up to x=1 when the four-element system is used as the material for a clad that does not emit light.

The thicknesses of the individual layers of the double-hetero structure are determined so as to obtain a large active layer carrier confinement effect and a large carrier recombination coefficient in the active layer (i.e., so as to increase the brightness of the LED). Owing to the band gap energy between the clad layers and the active layer, the clad layers of the DH structure operate to confine carriers in the active layer. To prevent carriers from slipping through by tunneling, therefore, the thickness of the clad layers is usually set at 0.5 μm or larger. On the one hand, a thin active layer is advantageous in that it increases the probability of recombination of the carriers (electrons and holes) injected into it but disadvantageous in that its smaller volume reduces the number of carriers that can be present. On the other, a thick active layer is advantageous in that the number of carriers present therein is high but disadvantageous in that the recombination probability is low. The optimum value of the active layer thickness therefore depends on the device structure and other factors. While in practice it is about 0.1–2 μm, the invention places no particular limits on the thickness of the active layer.

The thickness of the upper clad layer is preferably 3–50 μm. There are three reasons for this.

Figure 2:
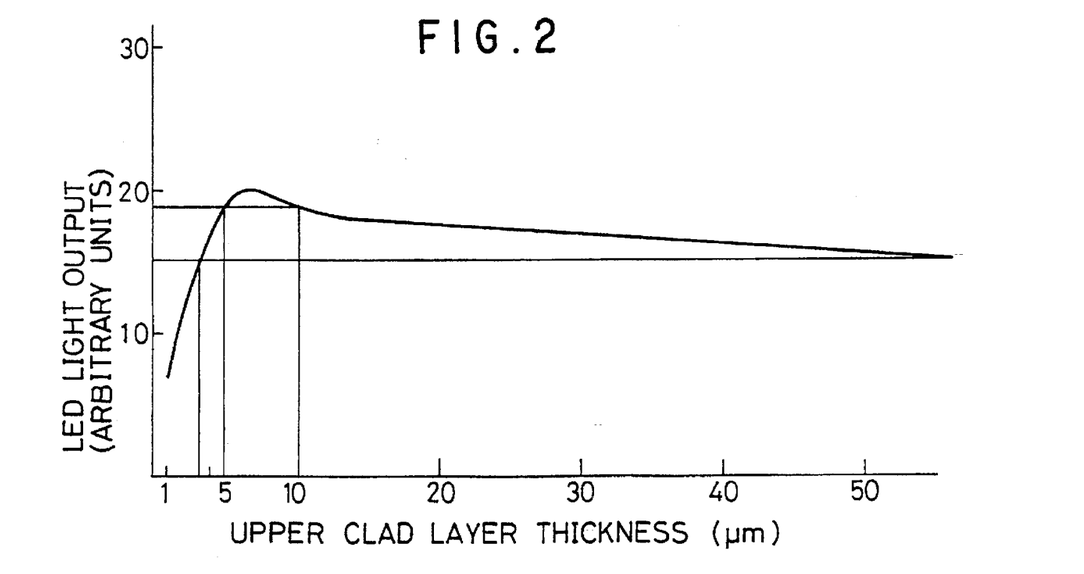
FIG. 2 is a graph showing how the light output of an LED according to the invention varies with thickness of the upper clad layer.

The first concerns the current diffusion effect. As shown in FIG. 12, in the prior art surface emission LED having an electrode structure, it is important from the point of increasing the LED brightness for the carriers injected from the upper electrode to spread over a wide area of the active layer so as to expand the emission area and increase the emission efficiency. Since four-element system materials usable in this wavelength region exhibit low carrier mobility, AlGaAs or the life has conventionally been used as the material for the current diffusion layer. However, use of AlGaAs or the like not only involves the risk of deterioration to be explained later but also entails the possibility that increase in the hetero-interface may lead to the occurrence in the energy band of the interface of notches which become a major obstacle to carrier injection (cause a rise in the driving voltage). This problem does not arise in this invention because a current diffusion effect is obtained by forming the diffusion layer as a 3–50 μm thick layer structure of the same material as the clad layers. FIG. 2 shows how the light output of the LED varies with thickness of the upper clad layer. As will be understood from this graph, the effect of increasing the thickness of the clad layer rises gradually with increasing clad layer thickness. For obtaining an LED with a brightness comparable to that of current commercially available LEDs, however, the thickness of the upper clad has to be at least 3 μm. Moreover, since about a three-fold increase in brightness at the same emission wavelength is required for achieving what can be considered a "bright" LED, a thickness of not less than 5 μm is preferable, although it should be understood that this intensity ratio is based on a comparison between an existing high-luminance AlGaAs LED and a GaP LED of the same wavelength. When the thickness of the upper clad layer exceeds 50 μm, the brightness drops below that of prior art LEDs, probably because of increasing absorption caused by lattice defects in the crystal of the upper clad layer. Moreover, from the earlier discussed aspects of maximum brightness based on a comparison with prior art LEDs and of production costs, the upper limit of the thickness of the upper clad layer is preferably around 10 μm.

Figure 3:
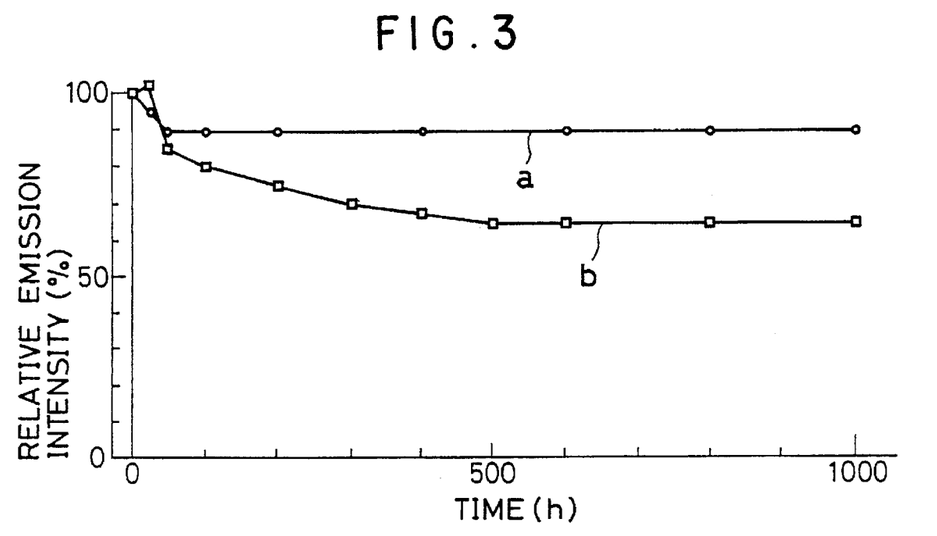
FIG. 3 is a graph comparing the reliability of the invention LED with that of a prior art LED having an AlGaAs window.

The second reason relates to reducing device deterioration. By nature, AlGaAs has smaller band gap energy than a four-element system and the Al mixing ratio of the mixed crystal has to be increased for making it transparent to light emitted by the active layer. The high Al content promotes deterioration in high-temperature, high-humidity environments. In this connection, reliability tests were conducted on a prior art LED having a 1-μm upper clad layer and a 4-μm AlGaAs window layer and an invention LED having a 5-μm upper clad layer above the active layer. As shown in FIG. 3, the emission intensity of the prior art LED decreased over time (curve b), while the emission intensity of the invention LED remained substantially level after falling off about 10% during an initial period of about 500 hours (curve a).

The third reason concerns the window effect arising in a short wavelength LED. When a four-element mixed crystal is used as the active layer, emission up to 550 nm (green) is possible. When AlGaAs is used as a window layer, however, the window becomes an absorber at a band gap energy of 2.16 eV (corresponding to an emission wavelength of 574 nm) even when the band gap of the AlAs is increased to the limit, making use as a current diffusion layer impossible with the same technology. According to the technical concept of the thick clad structure of the invention, however, insofar as the DH structure can be obtained, it is possible to configure an LED of the same structure.

It is also effective to vary the band gap energy of the upper clad layer as a function of thickness. As explained earlier, a large band gap energy of the clad layer is preferable for increasing carrier confinement effect in the active layer. If the band gap energy of the upper clad layer is gradually decreased from the bottom toward the top, however, the following effects can be obtained.

The first effect obtained by providing the upper clad layer with a band gradient is that of enabling efficient injection of carriers into the upper clad layer from the contact layer above. From the point of ease of ohmic electrode formation, a material with a small band gap energy (e.g. GaAs or the like) is usually used for the contact layer. Since this results in a large band gap energy difference between the contact layer and the upper clad layer, the current injection efficiency is degraded. As indicated by curve b in FIG. 5, however, the band gap energy difference at the contact layer interface can be held to a low level by gradually reducing the band gap energy of the upper clad layer in the direction of the contact layer within the range wherein absorption does not occur at the wavelength of the emission from the active layer. While the prior art AlGaAs current diffusion layer probably also produces this effect, the clad layer having the composition gradient of the invention is superior from the point of device reliability and the magnitude of the energy step formed.

The second effect is that of reducing the angular aperture of the surface electrode owing to the change in the index of refraction with band gap energy. The index of refraction of a material decreases approximately in inverse proportion to its band gap energy. In the upper clad layer having the aforementioned band gap energy profile, the index of refraction increases upward from the bottom of the upper clad layer. As a result, when the upper electrode is viewed from the active layer, the optical line (shortest optical path) bends outward from the electrode, so that the upper electrode appears smaller than it actually is. The area of the active layer covered by the upper electrode therefore becomes smaller. The prior art achieves a similar effect by increasing the depth of the emission section (the active layer in a DH structure; the junction in an SH or homo-structure) from the device surface. The invention is superior to this, however, as the prior art method greatly increases fabrication cost. Even when this effect is obtained, a decrease in the band gap energy of the clad layer still causes a decrease in the carrier confinement effect. As explained earlier, for preventing decrease of the carrier confinement effect it is preferable for a portion having a band gap energy at least 0.1 eV greater than that of the active layer to be present at least 0.5 μm from the interface with the active layer, namely, from the bottom of the upper clad layer. A four-element mixed crystal with such a band gap energy gradient can be fabricated by varying the value of x from the bottom to the top of the upper clad layer. This can be easily achieved by using the metallo-organic chemical vapor deposition (MOCVD) method, for example.

Although the carrier concentration used for the clad layers is generally in the range of $1\times10^{16}$ cm$^{-3}$ to $1.10\times10^{18}$ cm$^{-3}$, it is also effective to vary the concentration of the double-hetero structure layers as a function of depth. The invention does not particularly specify the conductivity type or carrier concentration of the active layer. If the carrier concentration of the clad sections is reduced with increasing proximity to the active layer, however, the following effects can be obtained.

First, this type of carrier concentration profile increases the resistivity in the vicinity of the active layer. In particular, adopting this type of profile in the upper clad layer increases the area of carrier injection from the upper electrode to the active layer, which has the effect of increasing the emission efficiency of the LED. Second, this type of carrier concentration profile prevents diffusion of added impurities to the active layer, particularly when adopted on the p-type clad layer side. Zinc, which is commonly used as a p-type impurity, is easily diffused by heat. It is also known that excess zinc atoms degrade the crystallinity of a III–V group compound semiconductor. A carrier profile that lowers the zinc concentration in the vicinity of the active layer interface, where good crystallinity is required, is highly effective for enhancing emission efficiency. It is therefore effective to vary the carrier concentration of both the upper and lower clad layers.

In addition, a synergistic effect is obtained when both the band gap energy gradient and the carrier concentration gradient are adopted. Although addition of impurity to the four-element mixed crystal becomes increasingly difficult as the x value of the Al mixing ratio increases, particularly in the case of p-type impurity addition, if the band gap energy is reduced by the foregoing method, i.e. if the Al mixing ratio x is reduced, the amount of p-type impurity doping can be increased to secure a carrier concentration gradient. As a result, the effects of both the band gap energy gradient and the carrier concentration gradient can be obtained.

Since excellent spreading of the current injected from an electrode is obtained with this configuration, a high emission efficiency can be achieved.

It is also effective for increasing the emission intensity to provide a lower reflecting layer between the buffer layer and the double-hetero structure. The reflecting layer is formed by alternately overlaying epitaxial growth layers with different indices of refraction. The requirements for obtaining a reflecting layer with high reflectance are that the layer be formed of a material with low absorption with respect to the target emission wavelength and that the difference between the indices of refraction of the constituent epitaxial layers be large. The total number of overlaid epitaxial layer pairs is about 10 to 25 and the individual layers are formed to a thickness equal to ¼ of the optical length of the target emission wavelength (layer thickness $\lambda/4n$, where the index of refraction of the layer is n and the target emission wavelength is $\lambda$). For example, in the case where the pairs of epitaxial layers are formed of AlGaAs having different Al contents and the target emission wavelength is 620 nm, a reflectance of not less than 90% in the 600–640 µm region can be obtained by laminating 25 layer pairs each consisting of a 41.9 nm thick layer of AlGaAs with an Al mixing ratio of 0.4 and a 49.3 nm thick layer of AlGaAs with an Al mixing ratio of 0.95. A laminated layer with similar effect can be obtained by combining layers of the four-element system material having x values in the ranges of 0–0.5 and 0.5–1.

An intermediate layer is provided between the lower reflecting layer and the lower clad layer for preventing lattice constant mismatching between the lower reflecting layer and the lower clad layer. The composition of the intermediate layer varies gradually between one near that of the lower clad layer at the upper part and one near that of the lower reflecting layer at the lower part.

The emission intensity can be further increased by providing an upper reflecting layer on the lower surface of an electrode disposed on the light emitting side that is opposite to the substrate side. In this case, the upper reflecting layer is interpreted similarly to the lower reflecting layer.

The contact layer which is fabricated between the upper clad layer and the upper metal electrode is selected for obtaining good ohmic contact with the metal electrode thereabove. Its thickness is ordinarily 0.1–1 µm and the material thereof is generally the same as that of the growth substrate. When GaAs is used as the substrate, GaAs of the opposite conductivity type from that of the substrate is used. For ease in forming the upper electrode and the ohmic electrode, the carrier concentration of the contact layer is set relatively high, at $(0.5-5)\times10^{18}$ cm$^{-3}$ or higher for an n-type layer and at $1\times10^{19}$ cm$^{-3}$ or higher for a p-type layer.

Typically, an n-type metal electrode is formed of Au/Au—Ge and a p-type one of Au/Au—Be.

Although the invention does not particularly specify the conductivity type of the substrate or the cap layers, the resistance to carrier injection may become very high when p-type GaAs is used for the substrate. This is because the band height on the interface between the GaAs substrate and the lower clad layer hinders passage of holes, which have large effective mass and are the main carriers of a p-type semiconductor, into the lower clad layer. To cope with this, the electrical resistance of the device can be lowered by inserting between the GaAs substrate and the lower clad layer a graded composition layer whose composition is continuously graded between that of the substrate and that of the lower clad layer. When the substrate is p-type GaAs and the lower clad layer is $(Al_xGa_{1-x})_yIn_{1-y}P$ in which x=0.7 and y=0.5, the graded composition layer consisting of $Al_aGa_bIn_{1-a-b}As_{1-p}P_p$ is graded between the interface with the GaAs substrate and the interface with the lower clad layer by varying the Al component a between 0 and 0.35, the Ga component b between 1 and 0.35, the In component (1–a–b) between 0 and 0.5, the As component (1–p) between 1 and 0 and the P component p between 0 and 1. In the case where the aforesaid laminated reflecting layer is inserted between the substrate and the lower clad layer, it is effective to insert a similar intermediate layer between the substrate and the reflecting layer and between the reflecting layer and the lower clad layer.

While the invention does not particularly specify the method for fabricating the aforesaid multilayer semiconductor, practical methods include MOCVD, gas-source molecular beam epitaxy and the like. Probably the most pragmatic way of fabricating the LED is to use MOCVD. The materials used in this method include various ethyl- and methyl-based alkyl metals (Al, Ga, In, Zn, Mg etc.) and hydrides of V-group elements (arsine, phosphine and hydrogen selenide, silane, disilane, hydrogen sulfide etc.) or organic V-group compounds (TBAs, TBP etc.).

By replacing the window layer and current diffusion layer of the prior art LED having an $(Al_xGa_{1-x})_yIn_{1-y}P$ double-hetero structure with a thick upper clad layer and limiting the properties thereof within specified ranges, this invention improves current diffusion and promotes growth of good quality crystal by reducing the epitaxial growth interface, thereby achieving improved emission efficiency.

Specific examples of the invention will now be described.

EXAMPLE 1

Figure 4:
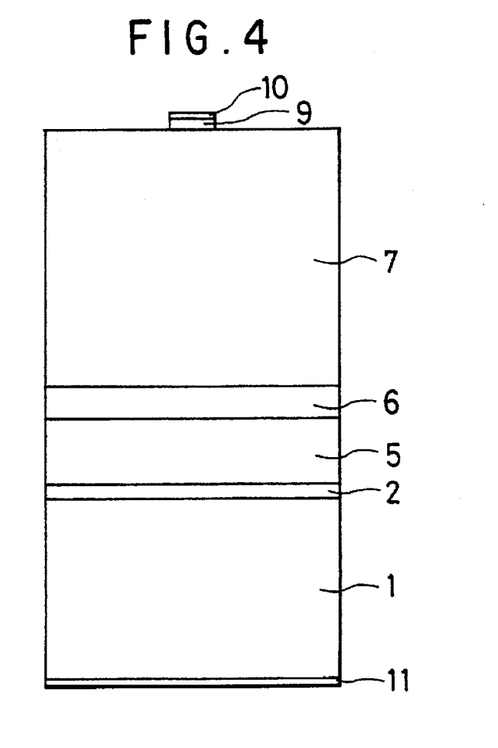
FIG. 4 is a sectional view for explaining the structures of LEDs that are Examples 1, 2, 3, 8 and 9 of the invention.

An LED with a DH structure was fabricated to have an $(Al_{0.2}Ga_{0.8})_{0.5}P$ emission layer on a GaAs substrate. The sectional structure of the LED is shown in FIG. 4. The substrate 1 was an n-type GaAs single crystal doped with Si. Its carrier concentration was $2.0 \times 10^{18}$ cm$^{-3}$. The face orientation was set 4 degrees inclined from (100). An epitaxial layer was grown on the substrate using MOCVD. TMAl, TMGa, TMIn, DEZn, and arsenine, phosphine and selenic hydrides were used as source gases. The composition of the grown crystal was varied by varying the gas mixing ratio. First a GaAs buffer layer 2 was grown on the substrate 1. The carrier concentration of the buffer layer 2 was adjusted to $1 \times 10^{18}$ cm$^{-3}$ by Se doping and its thickness was 0.5 µm.

An $(Al_xGa_{1-x})_yIn_{1-y}P$ double-hetero structure comprised of a lower clad layer 5, an active layer 6 and an upper clad layer 7 was formed next. The lower clad layer 5 was Se-doped n-type $(Al_{0.7}Ga_{0.3})_{0.5}In_{0.5}P$ obtained by setting the mixing ratios as x=0.7, y=0.5. Its carrier concentration was $1 \times 10^{18}$ cm$^{-3}$ and its thickness was 1 µm. The active layer 6 was undoped $(Al_{0.17}Ga_{0.83})_{0.17}In_{0.5}P$ obtained by setting the mixing ratios as x=0.17, y=0.5. Its carrier concentration was $5 \times 10^{15}$ cm$^{-3}$ and its thickness was 0.5 µm. The lower clad layer 5 was Zn-doped p-type $(Al_{0.7}Ga_{0.3})_{0.5}In_{0.5}P$ obtained by setting the mixing ratios as x=0.7, y=0.5. Its carrier concentration was $1 \times 10^{17}$ cm$^{-3}$ and its thickness was 6 µm. As a result, the band gap energies of the double-hetero structure section were Eg=2.29 eV at the lower clad 5, Eg=2.00 eV at the active layer 6 and Eg=2.29 eV at the upper clad layer 7. As shown by curve a in FIG. 5, the band gap energy profile of the upper clad layer was substantially constant. As shown by curve a in FIG. 6, the carrier concentration in the upper clad layer 7 was substantially constant.

A p-type GaAs contact layer 9 doped with Zn was then formed on the upper clad layer 7 to a thickness of 0.3 µm. Its carrier concentration was $1 \times 10^{18}$ cm$^{-3}$. (Au—Be)/Au was vacuum evaporated on the contact layer 9 to form an ohmic electrode 10 and (Au—Ge)/Au was evaporated on the opposite surface of the substrate to form an ohmic electrode 11, thus completing the fabrication of the LED.

An evaluation of the characteristics of the LED showed it to produce a light output of 20 a.u. (arbitrary units as measured by a specific measurement instrument) at a wavelength of 620 nm and a current of 20 mA, a great improvement in brightness over the 7 a.u. exhibited by a prior art LED with a 1 µm thick upper clad layer.

EXAMPLE 2

The overall structure of the layers in this example was also as shown in FIG. 4 but, differently from in the Example, the band gap energy of the upper clad layer 7 was graded. The composition of the upper clad layer 7 of Example 1 was substantially constant throughout, while in this Example 2, it was graded in the thickness direction. More specifically, in the vicinity of the interface with the active layer 6, it had mixing ratios of x=0.7, y=0.5, a carrier concentration of $1 \times 10^{17}$ cm$^{-3}$ and a band gap energy of 2.29 eV, at a distance of 0.5 µm from the interface with the active layer 6 it had mixing ratios of x=0.65, y=0.5, a carrier concentration of $1 \times 10^{17}$ cm$^{-3}$ and a band gap energy of 2.25 eV, and in the vicinity of the interface with the contact layer 9 it had mixing ratios of x=0.3, y=0.5, a carrier concentration of $2 \times 10^{17}$ cm$^{-3}$ and a band gap energy of 2.1 eV.

Figure 5:
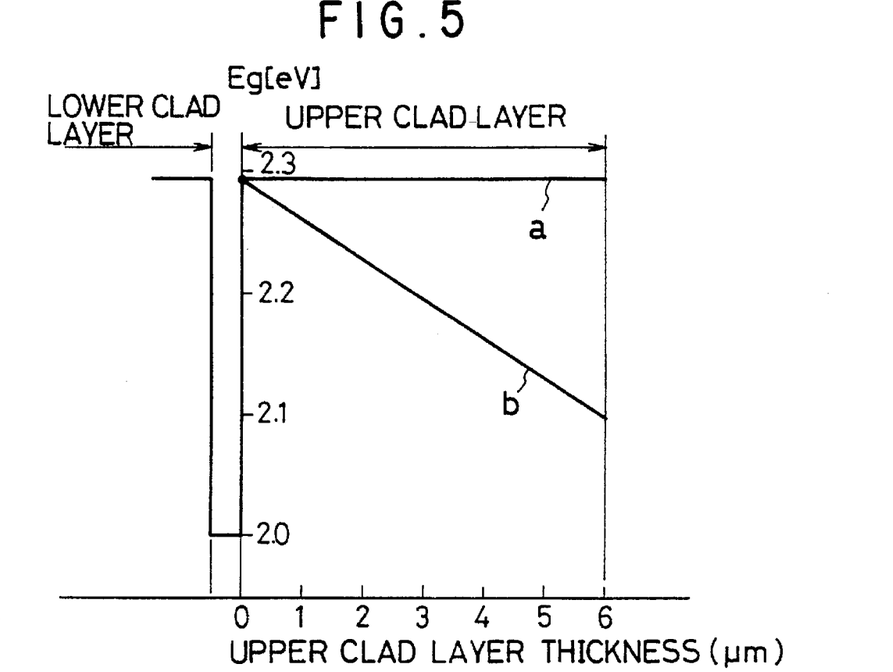
FIG. 5 is a diagram showing the band gap energy profile of LEDs that are Example 1 to Example 7 of the invention.
Figure 6:
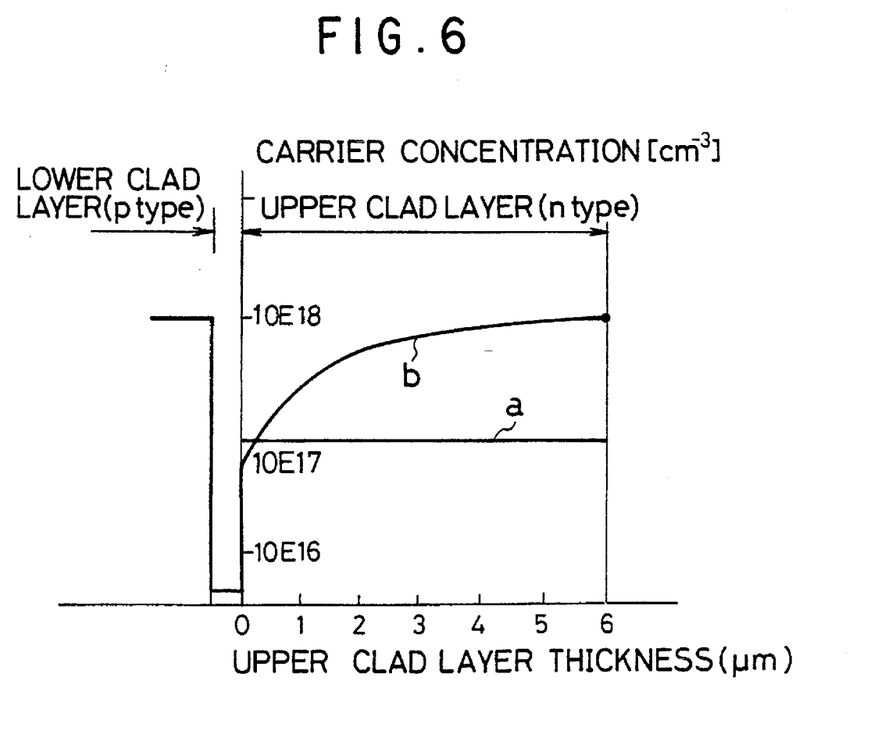
FIG. 6 is a diagram showing the carrier concentration profile of LEDs that are Example 1 to Example 7 of the invention.

As shown by curve b in FIG. 5, therefore, the band gap energy profile of the upper clad layer 7 of the double-hetero structure of the Example 2 started from about 0.3 eV higher than that of the active layer 6 and gradually declined in the direction of thickness of the upper clad layer 7. Moreover, as shown by curve a in FIG. 6, the carrier concentration was substantially constant in the upper clad layer 7.

An evaluation of the characteristics of the LED showed it to produce a light output of 22 a.u. at a wavelength of 620 nm and a current of 20 mA, a great improvement in brightness over the 7 a.u. exhibited by a prior art LED with a 1 µm thick upper clad layer.

EXAMPLE 3

The overall structure of the layers in this example was also as shown in FIG. 4. However, while the carrier concentration was substantially constant throughout the thickness of the upper clad layer 7 in Example 1, in this example it was increased in the thickness direction of the upper clad layer 7. In the vicinity of its interface with the active layer 6, the upper clad layer 7 had mixing ratios of x=0.7, y=0.5, a carrier concentration of $7 \times 10^{16}$ cm$^{-3}$ and a band gap energy of 2.29 eV. In the vicinity of its interface with the contact layer 9, the upper clad layer 7 had mixing ratios of x=0.7, y=0.5, a carrier concentration of $1 \times 10^{18}$ cm$^{-3}$ and a band gap energy of 2.29 eV which, as shown by curve a in FIG. 5, was substantially the same in the upper clad layer 7. As a result, the carrier concentration profile of the upper clad layer 7 of Example 3 was as shown by curve b in FIG. 6. Namely, the carrier concentration profile of the upper clad layer rose gradually from the vicinity of its interface with the active layer 6. An evaluation of the characteristics of the LED showed it to produce a light output of 24 a.u. at a wavelength of 620 nm and a current of 20 mA.

EXAMPLE 4

Figure 7:
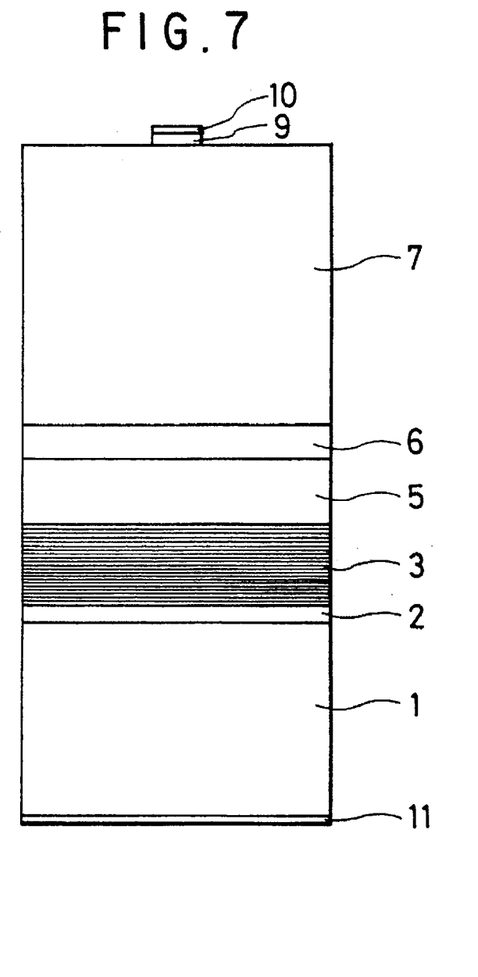
FIG. 7 is a sectional view for explaining the structures of LEDs that are Example 4 and Example 6 of the invention.

In the LED according to this example, a lower reflecting layer 3 was interposed between the buffer layer 2 and the lower clad layer 5. The sectional structure of the LED is shown in FIG. 7. The lower reflecting layer 3 was formed by laminating 25 layer pairs each consisting of a 41.9 nm thick layer of $Al_{0.4}Ga_{0.6}As$ doped with Se and a 49.3 nm thick layer of $Al_{0.95}Ga_{0.05}As$ doped with Se. The average carrier concentration of the two types of layers was $1.5 \times 10^{18}$ cm$^{-3}$. In other aspects Example 4 was the same as Example 1.

The band gap energy of the upper clad layer 7 was 2.29 eV and, as shown by curve a in FIG. 5, was substantially the same in the upper clad layer 7. The carrier concentration profile of the double-hetero structure was as shown by curve a in FIG. 6. Namely, the carrier concentration profile of the upper clad layer was substantially constant.

An evaluation of the characteristics of the LED showed it to produce a light output of 40 a.u. at a wavelength of 620 nm and a current of 20 mA.

EXAMPLE 5

Figure 1:
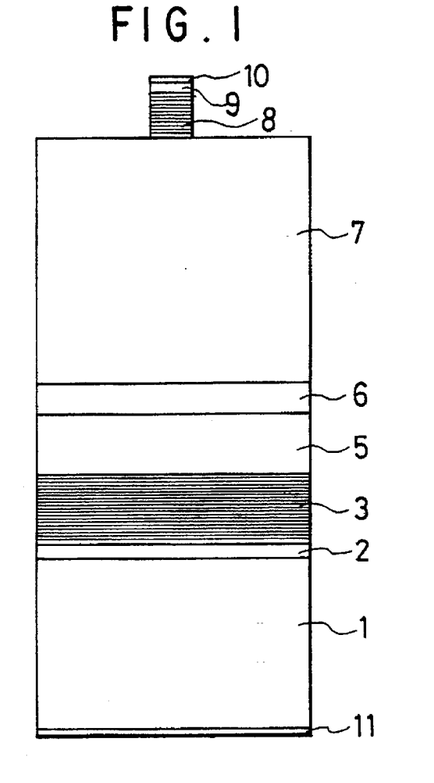
FIG. 1 is a sectional view for explaining the structures of semiconductor light emitting diodes (LEDs) that are Example 5 and Example 7 of the invention.

In the LED of this example, an upper reflecting layer 8 was provided between the upper clad layer 7 and the contact layer 9 of Example 4. The sectional structure of the LED is shown in FIG. 1. The upper reflecting layer 8 was formed by laminating 7 layer pairs each consisting of a 41.9 nm thick layer of $Al_{0.4}Ga_{0.6}As$ doped with Zn and a 49.3 nm thick layer of $Al_{0.95}Ga_{0.05}As$ doped with Zn. The average carrier concentration of the two types of layers was $1 \times 10^{18}$ cm$^{-3}$. In other aspects Example 5 was the same as Example 4.

The band gap energy of the upper clad layer 7 was 2.29 eV and, as shown by curve a in FIG. 5, was substantially the same in the upper clad layer 7. The carrier concentration profile of the double-hetero structure was as shown by curve a in FIG. 6. Namely, the carrier concentration profile of the upper clad layer 7 was substantially constant.

An evaluation of the characteristics of the LED showed it to produce a light output of 42 a.u. at a wavelength of 620 nm and a current of 20 mA.

EXAMPLE 6

In Example 4, the composition and carrier concentration of the upper clad layer 7 were substantially constant throughout the thickness of the upper clad layer 7. Differently from this, in this example, the Al mixing ratio x was reduced in the thickness direction and the carrier concentration was increased in the thickness direction. More specifically, in the vicinity of the interface with the active layer 6, the upper clad layer 7 had mixing ratios of x=0.7, y=0.5, a carrier concentration of $7 \times 10^{16}$ cm$^{-3}$ and a band gap energy of 2.29 eV. At a distance of 0.5 μm from the interface with the active layer 6, it had mixing ratios of x=0.65, y=0.5, a carrier concentration of $9 \times 10^{16}$ cm$^{-3}$ and a band gap energy of 2.25 eV. In the vicinity of the interface with the contact layer 9, it had mixing ratios of x=0.3, y=0.5, a carrier concentration of $1 \times 10^{18}$ cm$^{-3}$ and a band gap energy of 2.1 eV.

As shown by curve b in FIG. 5, therefore, the band gap energy profile of the upper clad layer of the double-hetero structure of Example 6 started from about 0.3 eV higher than that of the active layer 6 and gradually declined in the direction of thickness of the upper clad layer 7. Moreover, as shown by curve b in FIG. 6, the carrier concentration of the upper clad layer 7 gradually increased with increasing distance from the interface with the active layer. In addition, the reflecting layer 3 was formed by laminating 25 layer pairs each consisting of a 41.9 nm thick layer of $Al_{0.4}Ga_{0.6}As$ doped with Se and a 49.3 nm thick layer of $Al_{0.95}Ga_{0.05}As$ doped with Se. The average carrier concentration of the two type of layers was $1.5 \times 10^{18}$ cm$^{-3}$. In other aspects Example 6 was constituted the same as Example 1, yielding the configuration of FIG. 7.

An evaluation of the characteristics of the LED showed it to produce a light output of 52 a.u. at a wavelength of 620 nm and a current of 20 mA.

EXAMPLE 7

As in Example 5, in the LED of this example, an upper reflecting layer 8 and a lower reflecting layer 3 were adopted. The sectional structure of the LED was the same as shown in FIG. 1. The upper reflecting layer 8 was formed by laminating 7 layer pairs each consisting of a 41.9 nm thick layer of $Al_{0.4}Ga_{0.6}As$ doped with Zn and a 49.3 nm thick layer of $Al_{0.95}Ga_{0.05}As$ doped with Zn. The average carrier concentration of the two types of layers was $1 \times 10^{18}$ cm$^{-3}$. In other aspects Example 7 was the same as Example 6.

As shown by curve b in FIG. 5, the band gap energy profile of the upper layer of the double-hetero structure of Example 7 started from about 0.3 eV higher than that of the active layer 6 and gradually declined in the direction of thickness of the upper clad layer 7. Moreover, as shown by curve b in FIG. 6, the carrier concentration of the upper clad layer 7 gradually increased with increasing distance from the interface with the active layer 6.

An evaluation of the characteristics of the LED showed it to produce a light output of 54 a.u. at a wavelength of 620 nm and a current of 20 mA.

EXAMPLE 8

In this example the active layer 6 was formed of GaInP instead of the AlGaInP used in Example 1. The overall structure of the layers in this example was the same as that shown in FIG. 4. The active layer 6 was undoped $Ga_{0.5}In_{0.5}P$ obtained by setting mixing ratios of x=0, y=0.5. Its carrier concentration was $1 \times 10^{15}$ cm$^{-3}$ and its thickness was 0.5 μm. As a result, the band gap energies of the double-hetero structure section were Eg=2.29 eV at the lower clad layer 5, Eg=1.9 eV at the active layer 6, and Eg=2.29 eV at the upper clad layer 7. In other aspects Example 8 was the same as Example 1. An evaluation of the characteristics of the LED showed it to produce a light output of 31 a.u. at a wavelength of 650 nm and a current of 20 mA, a great improvement in brightness over the 9 a.u. exhibited by a prior art LED with a GaInP active layer and a 1 μm thick upper clad layer.

EXAMPLE 9

In this example the lower clad layer 5 and the upper clad layer 7 were formed of AlInP instead of the AlGaInP used in Example 1. The overall structure of the layers in this example was the same as that shown in FIG. 4. The lower clad layer 5 was Se-doped n-type $Al_{0.5}In_{0.5}P$ obtained by setting the mixing ratios as x=1, y=0.5. Its carrier concentration was $1 \times 10^{18}$ cm$^{-3}$ and its thickness was 1 μm. The active layer 6 was undoped $(Al_{0.7}Ga_{0.3})_{0.5}In_{0.5}P$ obtained by setting the mixing ratios as x=0.7, y=0.5. Its carrier concentration was $1 \times 10^{15}$ cm$^{-3}$ and its thickness was 0.5 μm. The upper clad layer 7 was Zn-doped p-type $Al_{0.5}In_{0.5}P$ obtained by setting the mixing ratios as x=1, y=0.5. Its carrier concentration was $5 \times 10^{16}$ cm$^{-3}$ and its thickness was 6 μm.

As a result, in the double-hetero structure section, the band gap energies were Eg=2.35 eV at the lower clad layer 5, Eg=2.00 eV at the active layer 6 and Eg=2.35 eV at the upper clad layer 7. In other aspects Example 9 was the same as Example 1.

An evaluation of the characteristics of the LED showed it to produce a light output of 30 a.u. at a wavelength of 620 nm and a current of 20 mA, a great improvement in brightness over the 10 a.u. exhibited by a prior art LED with AlInP upper and lower clad layers 5, 7, and a 1 μm thick upper clad layer 7.

EXAMPLE 10

In this example, the substrate 1 was a p-type GaAs single crystal doped with Zn. Its carrier concentration was $5.0 \times 10^{18}$ cm$^{-3}$. The face orientation was set 4 degrees inclined from (100).

A GaAs buffer layer 2 and a double-hetero structure were grown on the substrate 1 using MOCVD. The carrier concentration of the buffer layer 2 was adjusted to $1 \times 10^{18}$ cm$^{-3}$ by Se doping. Its thickness was 0.5 μm. The lower clad layer 5 of the double-hetero structure was Zn-doped p-type $(Al_{0.7}Ga_{0.3})_{0.5}In_{0.5}P$ obtained by setting mixing ratios of x=0.7, y=0.5. Its carrier concentration was $1 \times 10^{17}$ cm$^{-3}$ and its thickness was 1 μm. The active layer 6 was undoped $(Al_{0.25}Ga_{0.75})_{0.5}In_{0.5}P$ obtained by setting the mixing ratios as x=0.25, y=0.5. Its carrier concentration was $5 \times 10^{15}$ cm$^{-3}$ and its thickness was 0.5 μm. The band gap energy of the upper clad layer 7 was graded. More specifically, in the vicinity of the interface with the active layer 6, the upper clad layer 7 had mixing ratios of x=0.7, y=0.5, a carrier concentration of $7 \times 10^{16}$ cm$^{-3}$ and a band gap energy of 2.29 eV, at a distance of 0.5 μm from the interface with the active layer 6 it had mixing ratios of x=0.65, y=0.5, a carrier concentration of $2 \times 10^{17}$ cm$^{-3}$ and a band gap energy of 2.28 eV, and in the vicinity of the interface with the contact layer 9, at a distance of 6 μm from the interface with the active layer 6, it had mixing ratios of x=0.3, y=0.5, a carrier concentration of $1 \times 10^{18}$ cm$^{-3}$ and a band gap energy of 2.1 eV.

An n-type GaAs contact layer 9 doped with Se was then grown on the upper clad layer 7 to a thickness of 0.3 μm. Its carrier concentration was $1\times10^{18}$ cm$^{-3}$. (Au—Ge)/Au was vacuum evaporated on the contact layer 9 to form an ohmic electrode 10 and (Au—Be)/Au was evaporated on the bottom of the substrate to form an ohmic electrode 11, thus completing the fabrication of the LED.

An evaluation of the characteristics of the LED showed it to produce a light output of 25 a.u. at a wavelength of 620 nm and a current of 20 mA, a great improvement in brightness over the 7 a.u. exhibited by a prior art LED with a 1 μm thick upper clad layer.

EXAMPLE 11

Figure 8:
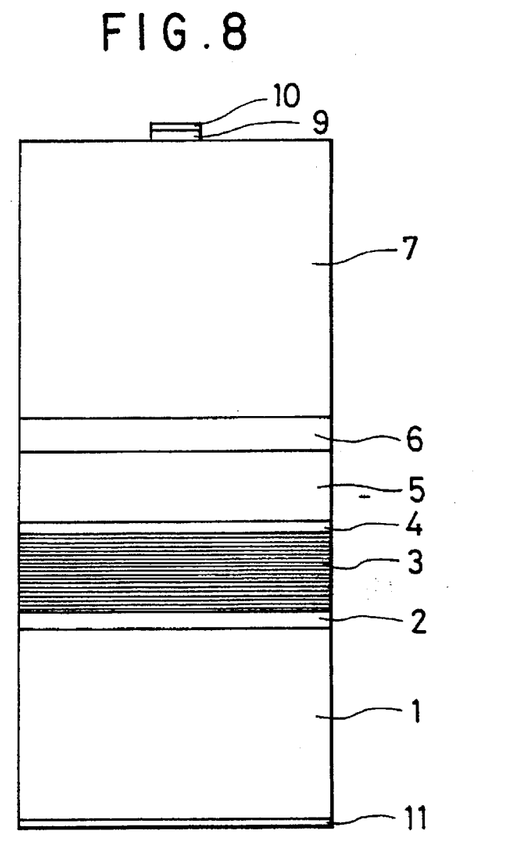
FIG. 8 is a sectional view for explaining the structures of LEDs that are Example 11 and Example 13 of the invention.

In the LED according to this example, a reflecting layer 3 was interposed between the buffer layer 2 and the lower clad layer 5 of the LED of Example 10. The sectional structure of the LED is shown in FIG. 8. The reflecting layer 3 was formed by laminating 12 layer pairs each consisting of a 41.9 nm thick layer of $Al_{0.4}Ga_{0.6}As$ doped with Zn and a 49.3 nm thick layer of $Al_{0.95}Ga_{0.05}As$ doped with Zn. The average carrier concentration of the two type of layers was $1.5\times10^{18}$ cm$^{-3}$.

This example was further provided with an intermediate layer 4 between the lower reflecting layer 3 and the lower clad layer 5. Since the uppermost layer of the lower reflecting layer 3 was an $Al_{0.4}Ga_{0.6}As$ layer 3a and the lower clad layer 5 was $(Al_{0.7}Ga_{0.3})_{0.5}In_{0.5}P$, the $Al_aGa_bIn_{1-a-b}As_{1-p}P_p$ intermediate layer 4 was graded between its interface with the lower reflecting layer 3 and its interface with the lower clad layer 5 by varying its Al mixing ratio a between 0.4 and 0.35, its Ga mixing ratio b between 0.6 and 0.15, its In mixing ratio (1–a–b) between 0 and 0.5, its As mixing ratio (1–p) between 1 and 0 and its P mixing ratio p between 0 and 1. The thickness of the intermediate layer 4 was 0.1 μm and its average carrier concentration was $1.5\times10^{18}$ cm$^{-3}$. In other aspects Example 11 was the same as Example 10.

An evaluation of the characteristics of the LED showed it to produce a light output of 50 a.u. at a wavelength of 620 nm and a current of 20 mA. Thus a brightness on the order of that of Example 10 was obtained. While the applied voltage required to obtain an injection current of 20 mA was about 7 V in Example 10, a voltage of not more than 2 volts was sufficient in this Example 11.

EXAMPLE 12

Figure 9:
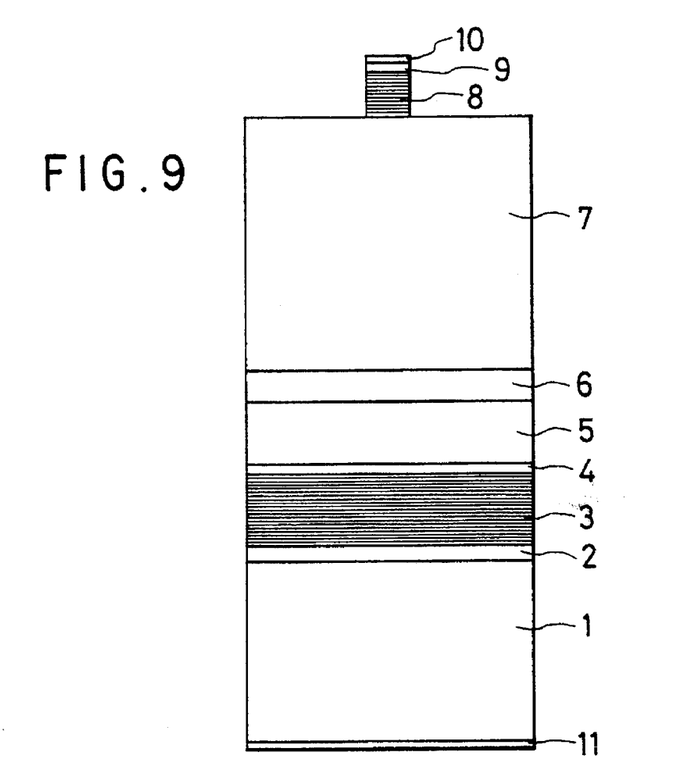
FIG. 9 is a sectional view for explaining the structure of an LED that is Example 12 of the invention.

In the LED of this example, an upper reflecting layer 8 was provided between the upper clad layer 7 and the contact layer 9 of Example 11. The sectional structure of the LED is shown in FIG. 9. The upper reflecting layer 8 was formed by laminating 7 layer pairs each consisting of a 41.9 nm thick layer of $Al_{0.4}Ga_{0.6}As$ doped with Se and a 49.3 nm thick layer of $Al_{0.95}Ga_{0.05}As$ doped with Se. The average carrier concentration of the two type of layers was $1\times10^{18}$ cm$^{-3}$. In other aspects Example 12 was the same as Example 11.

Figure 10:
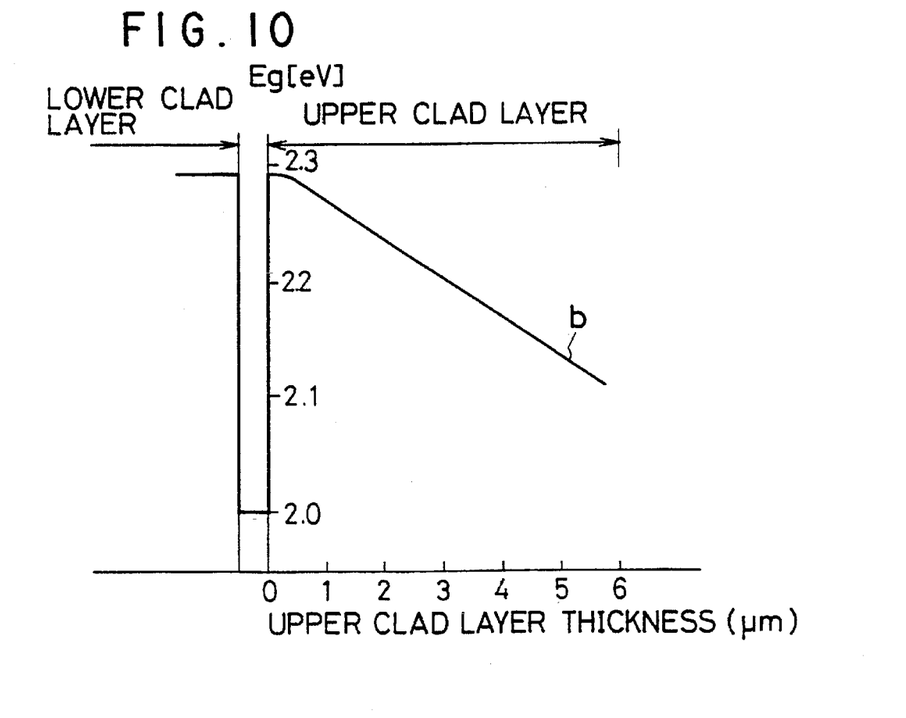
FIG. 10 is a diagram showing the band gap energy profile of LEDs that are Example 10 to Example 13 of the invention.
Figure 11:
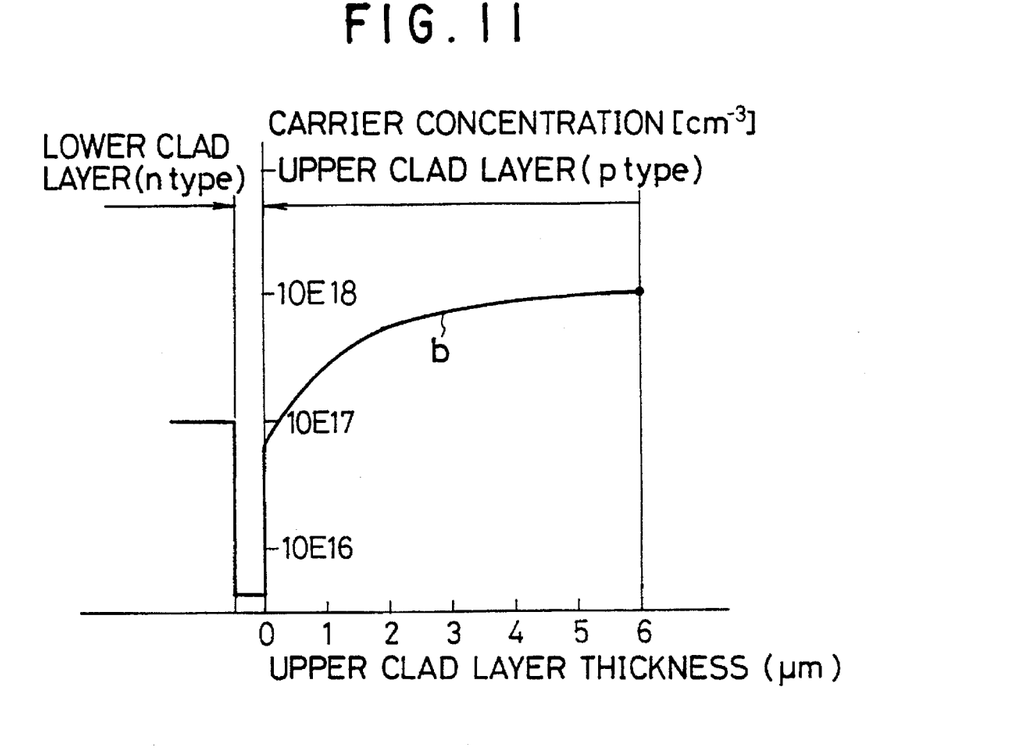
FIG. 11 is a diagram showing the carrier concentration profile of LEDs that are Example 10 to Example 13 of the invention.

As shown by curve b in FIG. 10, the band gap energy profile of the upper clad layer 7 of the double-hetero structure of this example was the same as that in Example 11. Namely, it started from about 0.3 eV higher than that of the active layer 6 and gradually declined in the direction of thickness of the upper clad layer. Moreover, as shown by curve b in FIG. 11, the carrier concentration of the upper clad layer 7 was the same as that in Example 11. Namely, it gradually increased with increasing distance from the interface with the active layer.

An evaluation of the characteristics of the LED showed it to produce, a light output of 52 a.u. at a wavelength of 620 nm and a current of 20 mA.

EXAMPLE 13

This example was fabricated in the same manner as Example 11 except that the thickness of the upper clad layer was 10 μm instead of 6 μm. An evaluation of the characteristics of the LED showed it to produce a light output of 54 a.u. at a wavelength of 620 nm and a current of 20 mA.

Since the invention provides an LED exhibiting high brightness over a broad region extending from red to green, it can be expected to make a major contribution to the use of LEDs in outdoor applications. Particularly noteworthy is that the invention provides LEDs with 3–4 times the brightness of prior art LEDs in the 590–650 nm wavelength region and, as such, can be expected to be applied to traffic signs, markers and the like.

What is claimed is:

1. A semiconductor light emitting diode comprising a compound semiconductor substrate and a double-hetero structure of $(Al_xGa_{1-x})_yIn_{1-y}P$ ($0 \leq x \leq 1$, $0 < y < 1$) as an active layer sandwiched between upper and lower clad layers, the upper clad layer having a larger band gap energy than the band yap energy of the active layer and having a thickness of 5–10 μm.

2. A semiconductor light emitting diode according to claim 1, wherein the band gap energy of the upper clad layer is at least 0.1 eV larger than the band gap energy of the active layer.

3. A semiconductor light emitting diode according to claim 2, wherein the double-hetero structure consists of AlGaInP.

4. A semiconductor light emitting diode according to claim 2, wherein the double-hetero structure consists of AlGaInP and GaInP.

5. A semiconductor light emitting diode according to claim 2, wherein the double-hetero structure consists of AlInP and AlGaInP.

6. A semiconductor light emitting diode according to claim 1, wherein the double-hetero structure consists of AlGaInP.

7. A semiconductor light emitting diode according to claim 1, wherein the double-hetero structure consists of AlGaInP and GaInP.

8. A semiconductor light emitting diode according to claim 1, wherein the double-hetero structure consists of AlInP and AlGaInP.

9. A semiconductor light emitting diode comprising a compound semiconductor substrate and a double-hetero structure of $(Al_xGa_{1-x})_yIn_{1-y}P$ ($0 \leq x \leq 1.0 < y < 1$) as an active layer sandwiched between upper and lower clad layers, the band gap energy of the upper clad layer gradually decreasing with increasing distance from a light emitting side of the active layer, wherein the band gap energy of the upper clad layer is at least 0.2 eV larger than that of the active layer at a distance 0.5 μm from its interface with the active layer.

10. A semiconductor light emitting diode according to claim 9, wherein the double-hetero structure consists of AlGaInP.

11. A semiconductor light emitting diode according to claim 9, wherein the double-hetero structure consists of AlGaInP and GaInP.

12. A semiconductor light emitting diode according to claim 9, wherein the double-hetero structure consists of AlInP and AlGaInP.

13. A semiconductor light emitting diode according to claim 9, wherein the upper clad layer has a thickness of 5–10 μm.

14. A semiconductor light emitting diode comprising compound semiconductor substrate and a double-hetero structure of $(Al_xGa_{1-x})_yIn_{1-y}P$ ($0 \leq x \leq 1.0 < y < 1$) as an active layer sandwiched between upper and lower clad layers, the band gap energy of the upper clad layer gradually decreasing with increasing distance from a light emitting side of the active layer, wherein the upper clad layer has a thickness of 5–10 µm.

15. A semiconductor light emitting diode according to claim 14, wherein the double-hetero structure consists of AlGaInP.

16. A semiconductor light emitting diode according to claim 14, wherein the double-hetero structure consists of AlGaInP and GaInP.

17. A semiconductor light emitting diode according to claim 14, wherein the double-hetero structure consists of AlInP and AlGaInP.

18. A semiconductor light emitting diode comprising compound semiconductor substrate and a double-hetero structure of $(Al_xGa_{1-x})_yIn_{1-y}P$ ($0 \leq x \leq 1.0 < y < 1$) as an active layer sandwiched between upper and lower clad layers, carrier concentration of the upper clad layer gradually increasing with increasing distance from a light emitting side of the active layer, wherein the upper clad layer has a thickness of 5–10 µm.

19. A semiconductor light emitting diode according to claim 18, wherein the carrier concentration of the upper clad layer is $(1-10) \times 10^{16}$ cm$^{-3}$ at its interface with the active layer and $(1-10) \times 10^{17}$ cm$^{-3}$ at the light emitting side.

20. A semiconductor light emitting diode according to claim 19, wherein the double-hetero structure consists of AlGaInP.

21. A semiconductor light emitting diode according to claim 19, wherein the double-hetero structure consists of AlGaInP and GaInP.

22. A semiconductor light emitting diode according to claim 19, wherein the double-hetero structure consists of AlInP and AlGaInP.

23. A semiconductor light emitting diode according to claim 18, wherein the double-hetero structure consists of AlGaInP.

24. A semiconductor light emitting diode according to claim 18, wherein the double-hetero structure consists of AlGaInP and GaInP.

25. A semiconductor light emitting diode according to claim 18, wherein the double-hetero structure consists of AlInP and AlGaInP.

* * * * *